(12) United States Patent
Hamman

(10) Patent No.: US 6,999,316 B2
(45) Date of Patent: Feb. 14, 2006

(54) LIQUID COOLING SYSTEM

(75) Inventor: Brian A. Hamman, Aubrey, TX (US)

(73) Assignee: QNX Cooling Systems Inc., Krugerville, TX (US)

( * ) Notice: Subject to any disclaimer, the term of this patent is extended or adjusted under 35 U.S.C. 154(b) by 75 days.

(21) Appl. No.: 10/666,189

(22) Filed: Sep. 10, 2003

(65) Prior Publication Data

US 2005/0052847 A1    Mar. 10, 2005

(51) Int. Cl.
*H05K 7/20* (2006.01)
*F28D 1/04* (2006.01)

(52) U.S. Cl. .............. 361/701; 361/688; 361/689; 165/104.31; 165/104.33

(58) Field of Classification Search ............... 165/80.4, 165/80.5, 104.19, 104.21, 104.33, 169, 170, 165/104.28, 104.31; 312/236; 361/676, 361/677, 689, 699, 700–703, 709–711, 688
See application file for complete search history.

(56) References Cited

U.S. PATENT DOCUMENTS

| | | | | |
|---|---|---|---|---|
| 4,610,222 A | * | 9/1986 | Goddard et al. | 123/41.42 |
| 5,323,847 A | * | 6/1994 | Koizumi et al. | 165/104.33 |
| 5,339,214 A | * | 8/1994 | Nelson | 361/695 |
| 5,383,340 A | * | 1/1995 | Larson et al. | 62/259.2 |
| 5,473,508 A | | 12/1995 | Porter et al. | |
| 5,606,341 A | * | 2/1997 | Aguilera | 345/87 |
| 5,634,351 A | * | 6/1997 | Larson et al. | 62/259.2 |
| 5,731,954 A | * | 3/1998 | Cheon | 361/699 |
| 5,764,483 A | * | 6/1998 | Ohashi et al. | 361/699 |
| 5,823,005 A | | 10/1998 | Alexander et al. | |
| 6,097,597 A | * | 8/2000 | Kobayashi | 361/687 |
| 6,234,240 B1 | * | 5/2001 | Cheon | 165/80.3 |
| 6,250,378 B1 | * | 6/2001 | Kobayashi | 165/104.33 |
| 6,263,957 B1 | | 7/2001 | Chen et al. | |
| 6,313,990 B1 | | 11/2001 | Cheon | |
| 6,529,376 B1 | | 3/2003 | Hamman | |
| 6,751,095 B1 | * | 6/2004 | Ishikawa et al. | 361/687 |
| 6,791,834 B1 | * | 9/2004 | Nakagawa et al. | 361/687 |

* cited by examiner

*Primary Examiner*—Anatoly Vortman
(74) *Attorney, Agent, or Firm*—Patent Dominion LP

(57) ABSTRACT

A liquid cooling system and apparatus is presented. A two-piece embodiment is presented. The first component is a heat transfer unit capable of engaging a processor and adapted to transfer heat from the processor to a liquid thereby generating heated liquid. The heated liquid is transported through a detachable input and output transport conduit to a second component. The second component is a heat exchange unit capable of cooling the liquid transported from the heat transfer unit. The heat exchange unit includes an input cavity for receiving the heated liquid, a heat dissipater for dissipating heat from the heated liquid thereby producing cooled liquid, and an output cavity for outputting the cooled liquid back to the heat transfer unit. In one embodiment, the heat exchange unit includes a pumping system for pumping the liquid from the heat exchange unit through the conduit to the heat transfer unit and back.

35 Claims, 9 Drawing Sheets

LIQUID COOLING SYSTEM

BACKGROUND OF THE INVENTION

Description of the Related Art

Processors are at the heart of most computing systems. Whether a computing system is a desktop computer, a laptop computer, a communication system, a television, etc., processors are often the fundamental building block of the system. These processors may be deployed as central processing units, as memories, controllers, etc.

As computing systems advance, the power of the processors driving these computing systems increases. The speed and power of the processors are achieved by using new combinations of materials, such as silicon, germanium, etc., and by populating the processor with a larger number of circuits. The increased circuitry per area of processor as well as the conductive properties of the materials used to build the processors result in the generation of heat. Further, as these computing systems become more sophisticated, several processors are implemented within the computing system and generate heat. In addition to the processors, other systems operating within the computing system may also generate heat and add to the heat experienced by the processors.

A range of adverse effects result from the increased heat. At one end of the spectrum, the processor begins to malfunction from the heat and incorrectly processes information. This may be referred to as computing breakdown. For example, when the circuits on a processor are implemented with digital logic devices, the digital logic devices may incorrectly register a logical zero or a logical one. For example, logical zeros may be mistaken as logical ones or vice versa. On the other hand, when the processors become too heated, the processors may experience a physical breakdown in their structure. For example, the metallic leads or wires connected to the core of a processor may begin to melt and/or the structure of the semiconductor material (i.e., silicon, germanium, etc.) itself may breakdown once certain heat thresholds are met. These types of physical breakdowns may be irreversible and render the processor and the computing system inoperable and un-repairable.

A number of approaches have been implemented to address processor heating. Initial approaches focused on air-cooling. These techniques may be separated into three categories: 1) cooling techniques which focused on cooling the air outside of the computing system; 2) cooling techniques that focused on cooling the air inside the computing system; and 3) a combination of the cooling techniques (i.e., 1 and 2).

Many of these conventional approaches are elaborate and costly. For example, one approach for cooling air outside of the computing system involves the use of a cold room. A cold room is typically implemented in a specially constructed data center, which includes air conditioning units, specialized flooring, walls, etc., to generate and retain as much cooled air within the cold room as possible.

Cold rooms are very costly to build and operate. The specialized buildings, walls, flooring, air conditioning systems, and the power to run the air conditioning systems all add to the cost of building and operating the cold room. In addition, an elaborate ventilation system is typically also implemented and in some cases additional cooling systems may be installed in floors and ceilings to circulate a high volume of air through the cold room. Further, in these cold rooms, computing equipment is typically installed in specialized racks to facilitate the flow of cooled air around and through the computing system. However, with decreasing profit margins in many industries, operators are not willing to incur the expenses associated with operating a cold room. In addition, as computing systems are implemented in small companies and in homes, end users are unable and unwilling to incur the cost associated with the cold room, which makes the cold room impractical for this type of user.

The second type of conventional cooling technique focused on cooling the air surrounding the processor. This approach focused on cooling the air within the computing system. Examples of this approach include implementing simple ventilation holes or slots in the chassis of a computing system, deploying a fan within the chassis of the computing system, etc. However, as processors become more densely populated with circuitry and as the number of processors implemented in a computing system increases, cooling the air within the computing system can no longer dissipate the necessary amount of heat from the processor or the chassis of a computing system.

Conventional techniques also involve a combination of cooling the air outside of the computing system and cooling the air inside the computing system. However, as with the previous techniques, this approach is also limited. The heat produced by processors has quickly exceeded beyond the levels that can be cooled using a combination of the air-cooling techniques mentioned above.

Other conventional methods of cooling computing systems include the addition of heat sinks. Very sophisticated heat sink designs have been implemented to create heat sinks that can remove the heat from a processor. Further, advanced manufacturing techniques have been developed to produce heat sinks that are capable of removing the vast amount of heat that can be generated by a processor. However, in most heat sinks, the size of the heat sink is directly proportional to the amount of heat that can be dissipated by the heat sink. Therefore, the more heat to be dissipated by the heat sink, the larger the heat sink. Certainly, larger heat sinks can always be manufactured; however, the size of the heat sink can become so large that heat sinks become infeasible.

Refrigeration techniques and heat pipes have also been used to dissipate heat from a processor. However, each of these techniques has limitations. Refrigeration techniques require substantial additional power, which drains the battery in a computing system. In addition, condensation and moisture, which is damaging to the electronics in computing systems, typically develops when using the refrigeration techniques. Heat pipes provide yet another alternative; however, conventional heat pipes have proven to be ineffective in dissipating the large amount of heat generated by a processor.

In yet another approach for managing the heat issues associated with a processor, designers have developed methods for controlling the operating speed of a processor to manage the heat generated by the processor. In this approach, the processing speed is throttled based on the heat produced by the processor. For example, as the processor heats to dangerous limits (i.e., computing breakdown or structural breakdown), the processing speed is stepped down to a lower speed.

At the lower speed, the processor is able to operate without experiencing computing breakdown or structural breakdown. However, this often results in a processor operating at a level below the level that the processor was marketed to the public or rated. This also results in slower overall performance of the computing system. For example, many conventional chips incorporate a speed step methodology. Using the speed step method, a processor reduces its speed by a percentage once the processor reaches a specific thermal threshold. If the processor continues to heat up to the second thermal threshold, the processor will reduce its speed by an additional 25 percent of its rated speed. If the heat continues to rise, the speed step methodology will continue to reduce the speed to a point where the processor will stop processing data and the computer will cease to function.

As a result of implementing the speed step technology, a processor marketed as a one-gigahertz processor may operate at 250 megahertz or less. Therefore, although this may protect a processor from structural breakdown or computing breakdown, it reduces the operating performance of the processor and the ultimate performance of the computing system. While this may be a feasible solution, it is certainly not an optimal solution because processor performance is reduced using this technique. Therefore, thermal (i.e., heat) issues negate the tremendous amount of research and development expended to advance processor performance.

In addition to the thermal issues, a heat dissipation method and/or apparatus must be deployed in the chassis of a computing system, which has limited space. Further, as a result of the competitive nature of the electronics industry, the additional cost for any heat dissipation method or apparatus must be very low or incremental.

Thus, there is a need in the art for a method and apparatus for cooling computing systems. There is a need in the art for a method and apparatus for cooling processors deployed within a computing system. There is a need in the art for an optimal, cost effective method and apparatus for cooling processors, which also allows the processor to operate at the marketed operating capacity. There is a need for a method or apparatus used to dissipate processor heat which can be deployed within the small footprint available in the case or housing of a computing system, such as a laptop computer, standalone computer, cellular telephone, etc.

SUMMARY OF THE INVENTION

A method of liquid cooling is presented. In one embodiment, a two-piece detachable liquid cooling system is presented. The two-piece detachable liquid cooling system facilitates easy manufacture. In addition, the unit is strategically designed to occupy a small amount of space within the limited area of a computing system housing.

In one embodiment, a liquid cooling system including a heat transfer unit and a heat exchange unit is presented. The heat transfer unit is capable of attachment to a processor and dissipates heat from the processor. The heat exchange unit is in communication with the heat transfer unit and cools heated liquid communicated from the heat transfer unit. In a second embodiment, the heat transfer unit is directly coupled to the heat exchange unit through a conduit without any additional intermediate components. In a third embodiment, the heat transfer unit is a single consolidated unit including an input cavity, a dissipater and an output cavity with a pump deployed in the output cavity.

In another embodiment of the present invention, a variety of methods are used to dissipate heat from a processor. The methods may be used individually or in combination. Using the methods in combination results in heat dissipation that is exponentially greater than using each method individually.

In one embodiment, power is applied to a liquid cooling system to circulate liquid through the liquid cooling system to dissipate heat. In a second embodiment, an inlet and an outlet are strategically placed in a heat transfer unit and a heat exchange unit to take advantage of the heating and cooling of liquid in the liquid cooling system. As a result, liquid circulates within the system and dissipates heat without power. In a third embodiment, air is applied to the heat exchange unit to dissipate additional heat. In a fourth embodiment, air from within the housing or chassis of the computing system is expelled outside of the housing of the computer to dissipate heat produced by the processor.

In one embodiment, a first liquid momentum is generated by intaking a cooled liquid at a location in a heat transfer unit, transforming the cooled liquid to heated liquid by heating the cooled liquid in the heat transfer unit, and expelling the heated liquid from a position above the location used for intaking the cooled liquid. The first liquid momentum helps to circulate liquid in the liquid cooling system.

A second liquid momentum is generated by intaking the heated liquid at a location, cooling the heated liquid in a heat exchange unit, and expelling the cooled liquid from a location that is below the location used to intake the heated liquid. The second liquid momentum combines with the first liquid momentum to circulate the liquid in the liquid cooling system. The combination of the first liquid momentum and the second liquid momentum (i.e., convective liquid circulation) results in cooling even after power to the computing system has been shut down and virtually eliminates hot start problems. The convective liquid circulation also helps to eliminate a rapid rise processor temperature just after a processor has been shut down, which is a common occurrence in prior art processors. Further, convective liquid circulation enhances the forced liquid circulation resulting from the use of the pump and allows the system to recycle the heat into a physical force to move liquid through the system. Lastly, the convective liquid circulation allows the system to be more efficient by consuming less electrical power during operation. In one embodiment, as little as 5.7 watts of power is required to operate the liquid cooling system.

A liquid cooling system comprises a heat exchange unit coupled to a conduit, the heat exchange unit receiving heated liquid transported on the conduit and generating cooled liquid which is transported on the conduit; and a heat transfer unit capable of interfacing with a processor and coupled through the conduit to the heat exchange unit, the heat transfer unit receiving the cooled liquid transported on the conduit and generating the heated liquid transported on the conduit.

A liquid cooling system comprises an input conduit transporting heated liquid including heat; a heat exchange unit comprising, an input cavity coupled to the input conduit and receiving the heated liquid including heat, a dissipater coupled to the input cavity and dissipating the heat thereby generating cooled liquid, and an output cavity coupled to the dissipater and receiving the cooled liquid; an output conduit coupled to the output cavity and transporting the cooled liquid; and a heat transfer unit interfacing with a processor generating the heat and coupled through the input conduit and the output conduit to the heat exchange unit, the heat transfer unit receiving the cooled liquid transported on the output conduit, generating the heated liquid transported on the input conduit by transferring the heat to the cooled liquid and transporting the heated liquid on the input conduit.

A method of dissipating heat from a processor deployed in a housing, the method comprises the steps of performing forced circulation of liquid to transport the heat from the processor; performing convective circulation of liquid to transport the heat from the processor; and dissipating the heat in the processor in response to performing the forced circulation of the liquid and in response to performing the convective circulation of the liquid.

A method of cooling a processor capable of generating heat, the processor in contact with a heat transfer unit the heat transfer unit including an outlet positioned above an inlet, the heat transfer unit coupled to a heat exchange unit, the heat exchange unit comprising an input cavity, a heat dissipater positioned below the input cavity and an output cavity positioned below the heat dissipater, the method comprises the steps of receiving cooled liquid in the inlet of the heat transfer unit; generating heated liquid in response to transferring the heat from the processor and in response to receiving the cooled liquid in the inlet of the heat transfer unit; outputting heated liquid out of the outlet of the heat transfer unit in response to generating the heated liquid; receiving the heated liquid in the input cavity of the heat exchange unit in response to outputting the heated liquid out of the outlet of the heat transfer unit; generating cooled liquid in the dissipater in response to receiving the heated liquid in the input cavity; and outputting the cooled liquid to the output cavity in response to generating cooled liquid in the dissipater.

A method of cooling a processor deployed in a system after system shutdown, the processor capable of generating heat, the processor coupled to a heat transfer unit the heat transfer unit including an outlet positioned above an inlet, the heat transfer unit coupled to a heat exchange unit, the heat exchange unit comprising an input cavity, a dissipater positioned below the input cavity and an output cavity positioned below the dissipater, the method comprises the steps of generating first liquid circulation by receiving cooled liquid in the inlet of the heat transfer unit, heating the cooled liquid in the heat transfer unit, and outputting heated liquid out of the outlet of the heat transfer unit; generating second liquid circulation by receiving heated liquid in the input cavity, cooling the heated liquid in the dissipater and outputting the cooled liquid from the output cavity; and cooling a processor deployed in a system after system shutdown in response to generating first liquid circulation and in response to generating second liquid circulation.

A two-piece liquid cooling system comprises a heating unit comprising a first output conduit receiving cooled fluid, a heat transfer unit capable of attachment to a processor and coupled to the first output conduit the heat transfer means transforming the cooled fluid to heated fluid and a first input conduit coupled to the heat transfer unit and transporting the heated fluid; and a cooling unit comprising a second input conduit coupled to the first input conduit and transporting the heated fluid, a heat exchange unit coupled to the second input conduit and transporting the heated fluid, the heat exchange generating cooled fluid in response to the heated fluid transported on the second input conduit, a second output conduit coupled to the dissipater, the second output conduit coupled to the first output conduit and transporting the cooled liquid from the dissipater to the first output conduit.

DETAILED DESCRIPTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

In one embodiment of the present invention, a two-piece liquid cooling system is presented. The two-piece liquid cooling system includes: (1) a heat transfer unit, which is capable of attachment to a processor, and (2) a heat exchange unit. In one embodiment, a single conduit is used to couple the heat transfer unit to the heat exchange unit. In a second embodiment, an input conduit transporting heated liquid and an output conduit transporting cooled liquid are used to couple the heat transfer unit to the heat exchange unit. It should also be appreciated that the two-piece liquid cooling system may also be deployed as a one-piece liquid cooling system by deploying the heat transfer unit and the heat exchange unit in a single unit (i.e., a single consolidated embodiment).

The two-piece liquid cooling system utilizes several mechanisms to dissipate heat from a processor. In one embodiment, liquid is circulated in the two-piece liquid cooling system to dissipate heat from the processor. The liquid is circulated in two ways. In one embodiment, power is applied to the two-piece liquid cooling system and the liquid is pumped through the two-piece liquid cooling system to dissipate heat from the processor. For the purposes of this discussion, this is referred to as forced liquid circulation.

In a second embodiment, liquid input points and exits points are specifically chosen in the heat transfer unit and the heat exchange unit to take advantage of the heating and cooling of the liquid and the momentum resulting from the heating and cooling of the liquid. For the purposes of discussion, this is referred to as convective liquid circulation.

In another embodiment, air-cooling is used in conjunction with the liquid cooling to dissipate heat from the processor. In one embodiment, the air-cooling is performed by strategically placing fans in the housing of the computing system. In a second embodiment, the air-cooling is performed by strategically placing a fan relative to the heat exchange unit to increase the cooling performance of the heat exchange unit. In yet another embodiment, heated air is expelled from the system during cooling to provide for a significant dissipation of heat.

Figure 1:
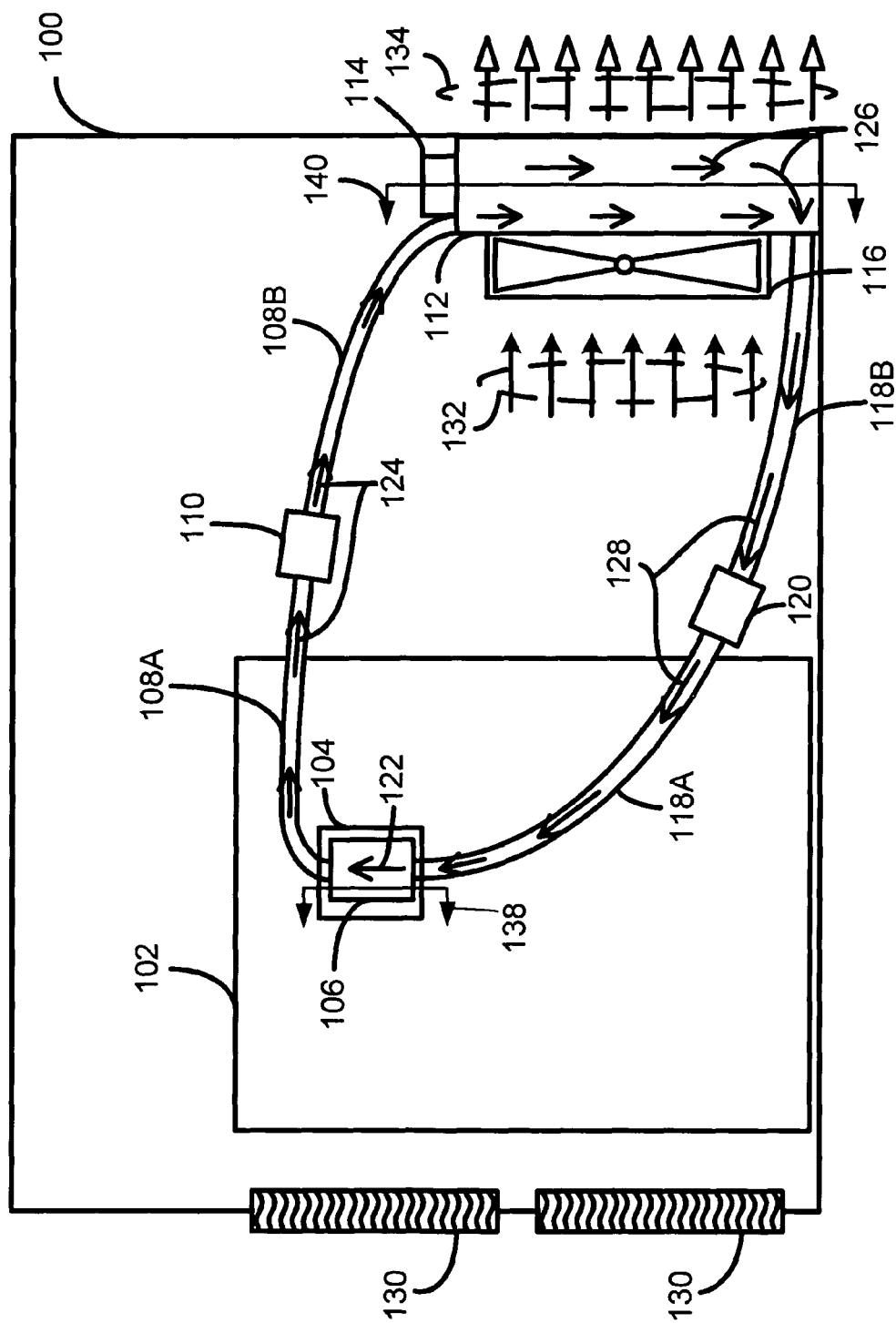
FIG. 1 displays a system view of a liquid cooling system disposed in a housing and implemented in accordance with the teachings of the present invention.

FIG. 1 displays a system view of a liquid cooling system disposed in a housing and implemented in accordance with the teachings of the present invention. A housing or case 100 is shown. In one embodiment, the housing or case 100 may be a computer case, such as a standalone computer case, a laptop computer case, etc. In another embodiment, the housing or case 100 may include the case for a communication device, such as a cellular telephone case, etc. It should be appreciated that the housing or case 100 will include any case or containment unit, which houses a processor.

The housing or case 100 includes a motherboard 102. The motherboard 102 includes any board that contains a processor 104. A motherboard 102 implemented in accordance with the teachings of the present invention may vary in size and include additional electronics and processors. In one embodiment, the motherboard 102 may be implemented with a printed circuit board (PCB).

A processor 104 is disposed in the motherboard 102. The processor 104 may include any type of processor 104 deployed in a modern computing system. For example, the processor 104 may be an integrated circuit, a memory, a microprocessor, an opto-electronic processor, an application specific integrated circuit (ASIC), a field programmable gate array (FPGA), an optical device, etc., or a combination of foregoing processors.

In one embodiment, the processor 104 is connected to the heat transfer unit 106 using a variety of connection techniques. For example, attachment devices, such as clips, pins, etc., are used to attach the heat transfer unit 106 to the processor 104. In addition, mechanisms for providing for a quality contact (i.e., good heat transfer), such as epoxies, etc., may be disposed between the heat transfer unit 106 and the processor 104 and are within the scope of the present invention.

The heat transfer unit 106 includes a cavity (not shown in FIG. 1) through which liquid flows in a direction denoted by liquid direction arrow 122. In one embodiment, the heat transfer unit 106 is manufactured from a material, such a copper, which facilitates the transfer of heat from the processor 104. In another embodiment, the heat transfer unit 106 may be constructed with a variety of materials, which work in a coordinated manner to efficiently transfer heat away from the processor 104. It should be appreciated that the heat transfer unit 106 and the processor 104 may vary in size. For example, in one embodiment, the heat transfer unit 106 may be larger than the processor 104.

An input conduit denoted by 108A/108B is connected to the heat transfer unit 106. In one embodiment, the input conduit 108A/108B may be built into the body of the heat transfer unit 106. In another embodiment, the input conduit 108A/108B may be connected and detachable from heat transfer unit 106. In one embodiment, the input conduit 108A/108B is a liquid pathway that facilitates the transfer of liquid from the heat transfer unit 106.

An output conduit 118A/118B is connected to the heat transfer unit 106. In one embodiment, the output conduit 118A/118B may be built into the body of the heat transfer unit 106. In another embodiment, the output conduit 118A/118B may be connected and detachable from heat transfer unit 106. In one embodiment, the output conduit 118A/118B is a liquid pathway that facilitates the transfer of liquid to the heat transfer unit 106.

In one embodiment, the input conduit 108A/108B and the output conduit 118A/118B may be combined into a single conduit coupling the heat transfer unit 106 to the heat exchange unit 112, where the single conduit transports both the heated and cooled liquid. In another embodiment, the input conduit 108A/108B and the output conduit 118A/118B may be combined into a single conduit coupling the heat transfer unit 106 to the heat exchange unit 112, where the single conduit is segmented into two conduits, one for transporting the heated liquid and one for transporting the cooled liquid. In addition, in one embodiment, an opening or liquid pathway transferring liquid directly between the heat transfer unit 106 and the heat exchange unit 112 without traversing any intermediate components (i.e., other than conduit connectors) may be considered a conduit, such as input conduit 108A/108B and/or output conduit 118A/118B. Both the input conduit 108A/108B and the output conduit 118A/118B may be made from a plastic material, metallic material, or any other material that would provide the desired characteristics for a specific application.

In one embodiment, the input conduit 108A/108B includes three components: input conduit 108A, connection unit 110, and input conduit 108B. Input conduit 108A is connected between the heat transfer unit 106 and the connection unit 110. Input conduit 108B is connected between connection unit 110 and heat exchange unit 112. However, it should be appreciated that in one embodiment, a single uniform connection may be considered an input conduit 108A/108B. In a second embodiment, the combination of input conduit 108A, 110, and 108B may combine to form a single conduit.

In one embodiment, the output conduit 118A/118B may also include three components: output conduit 118B, connection unit 120, and output conduit 118B. Output conduit 118A is connected between the heat transfer unit 106 and the connection unit 120. Output conduit 118B is connected between connection unit 120 and heat exchange unit 112. However, it should be appreciated that in one embodiment, a single uniform conduit may be considered an output conduit 118A/118B. In a second embodiment, the combination of output conduit 118A, 120, and 118B may combine to form a single conduit.

In one embodiment, a motor 114 is positioned relative to heat exchange unit 112 to power the operation of the heat exchange unit 112. A fan 116 is positioned relative to the heat exchange unit 112 to move air denoted as 132 within the housing or case 100 and expel the air 132 through and/or around the heat exchange unit 112 to the outside of the housing or case 100 as denoted by air 134. It should be appreciated that the fan 116 may be positioned in a variety of locations including between the heat exchange unit 112 and the housing or case 100. In addition, in one embodiment, air vents 130 may be disposed at various locations within the housing or case 100.

In one embodiment, liquid is circulated in the liquid cooling system depicted in FIG. 1 to dissipate heat from processor 104. In one embodiment, the liquid (i.e., cooled liquid, heated liquid, etc.) is a non-corrosive propylene glycol based coolant.

It should be appreciated that several two-piece liquid cooling system are presented in the instant application. For example, heat transfer unit 106 may be considered the first piece and heat exchange unit 112 may be considered the second piece of a two-piece liquid cooling system. In another embodiment, heat transfer unit 106 in combination with input conduit 108A and output conduit 118A may be considered the first piece of a two-piece liquid cooling system, and heat exchange unit 112 in combination with input conduit 108B and output conduit 118B may be considered the second piece of a two-piece liquid cooling system. It should be appreciated that a number of elements of the liquid cooling system may be combined to deploy the liquid cooling system as a two-piece liquid cooling system. For example, the motor 114 may be combined with the heat exchange unit 112 to produce one piece of a two-piece liquid cooling system.

During operation, cooled liquid as depicted by direction arrows 128 is transported in the output conduit 118A/118B to the heat transfer unit 106. The cooled liquid 128 in the output conduit 118A/118B moves through a cavity in the heat transfer unit 106 as shown by liquid direction arrow 122. In one embodiment, the heat transfer unit 106 transfers heat from the processor 104 to the liquid denoted by direction arrow 122. Heating the liquid in the heat transfer unit 106 with the heat from the processor 104 transforms the cooled liquid 128 to heated liquid. It should be appreciated that the terms cooled liquid and heated liquid are relative terms as used in this application and represent a liquid that has been cooled and a liquid that has been heated, respectively. The heated liquid is then transported on input conduits 108A/108B as depicted by directional arrows 124. In one embodiment of the present invention, the cooled liquid 128 enters the heat transfer unit 106 at a lower point than the exit point for the heated liquid depicted by directional arrows 124. As a result, as the cooled liquid 128 is heated it becomes lighter and rises in the heat transfer unit 106. This creates liquid movement, liquid momentum, and liquid circulation (i.e., convective liquid circulation) in the liquid cooling system.

The heated liquid 124 is transported through input conduit 108A/108B to the heat exchange unit 112. The heated liquid depicted by directional arrows 124 enters the heat exchange unit 112 through input conduit 108B. The heated liquid 124 has liquid momentum as a result of being heated and rising in the heat transfer unit 106. It should be appreciated that the circulation of the heated liquid 124 is also aided by the pump assembly (not shown) associated with the heat exchange unit 112. The heated liquid 124 then flows through the heat exchange unit 112 as depicted by directional arrows 126. As the heated liquid 124 flows through the heat exchange unit 112, the heated liquid 124 is cooled. As the heated liquid 124 is cooled, the heated liquid 124 becomes heavier and falls to the bottom of the heat exchange unit 112. The cooler, heavier, liquid falling to the bottom of the heat exchange unit 112 also creates liquid movement, liquid momentum, and liquid circulation (i.e., convective liquid circulation) in the system. The cooled liquid 128 then exits the heat exchange unit 112 through the output conduit 118B.

As a result, in one embodiment of the present invention, liquid circulation is created by: (1) heating cooled liquid 128 in heat transfer unit 106 and then (2) cooling heated liquid 124 in heat exchange unit 112. In both scenarios, liquid is introduced at a certain position in the heat transfer unit 106 and the heat exchange unit 112 to create the momentum (i.e., convective liquid circulation) resulting from heating and cooling of the liquid. For example, in one embodiment, cooled liquid 128 is introduced in the heat transfer unit 106 at a position that is below the position that the heated liquid 124 exits the heat transfer unit 106. Therefore, output conduit 118A, which transports cooled liquid 128 to heat transfer unit 106 is positioned below input conduit 108A which transports the heated liquid 124 away from the heat transfer unit 106. As a result, after the cooled liquid 128 transported and introduced into the heat transfer unit 106 by output conduit 118A is transformed to heated liquid 124, the lighter heated liquid 124 rises in the heat transfer unit 106 and exits through input conduit 108A which is positioned above output conduit 118A. In one embodiment, positioning input conduit 108A above output conduit 118A enables input conduit 108A to receive and transport the lighter heated liquid 124 which rises in the heat transfer unit 106.

A similar scenario occurs with the heat exchange unit 112. The input conduit 108B, which transports the heated liquid 124, is positioned above the output conduit 118B, which transports the cooled liquid 128. For example, in one embodiment, input conduit 108B is positioned at the top portion of the heat exchange unit 112. Therefore, heated liquid 124 is introduced into the top of the heat exchange unit 112. As the heated liquid 124 cools in heat exchange unit 112, the heated liquid 124 becomes heavier and falls to the bottom of heat exchange unit 112. An output conduit 118B is then positioned at the bottom of the heat exchange unit 112 to receive and transport the cooled liquid 128.

In addition to the convective liquid circulation occurring as a result of the positioning of inlet and outlet points in the heat transfer unit 106 and the heat exchange unit 112, a pump (not shown in FIG. 1) is also used to circulate liquid within the liquid cooling system. For the purposes of discussion, the liquid circulation resulting from the use of power (i.e., the pump) may be called forced circulation. Therefore, processor heat dissipation is accomplished using convective liquid circulation and forced circulation.

In addition to circulating liquid within the liquid cooling system, a fan 116 is used to move air across, around, and through the heat exchange unit 112. In one embodiment, the fan 116 is positioned to move air through and around the heat exchange unit 112 to create substantial additional liquid cooling with the heat exchange unit 112. In another embodiment, air (i.e., depicted by 132) heated within the housing or case 100 is expelled outside of the housing or case 100 as depicted by 134 to provide additional heat dissipation.

In one embodiment, each of the methods, such as convective liquid circulation, forced liquid circulation, delivering air through the heat exchange unit 112, and expelling air from within the housing or case 100, may each be used separately or in combination. As each technique is combined or added in combination, an exponentially increasing amount of heat dissipation is achieved.

Figure 2:
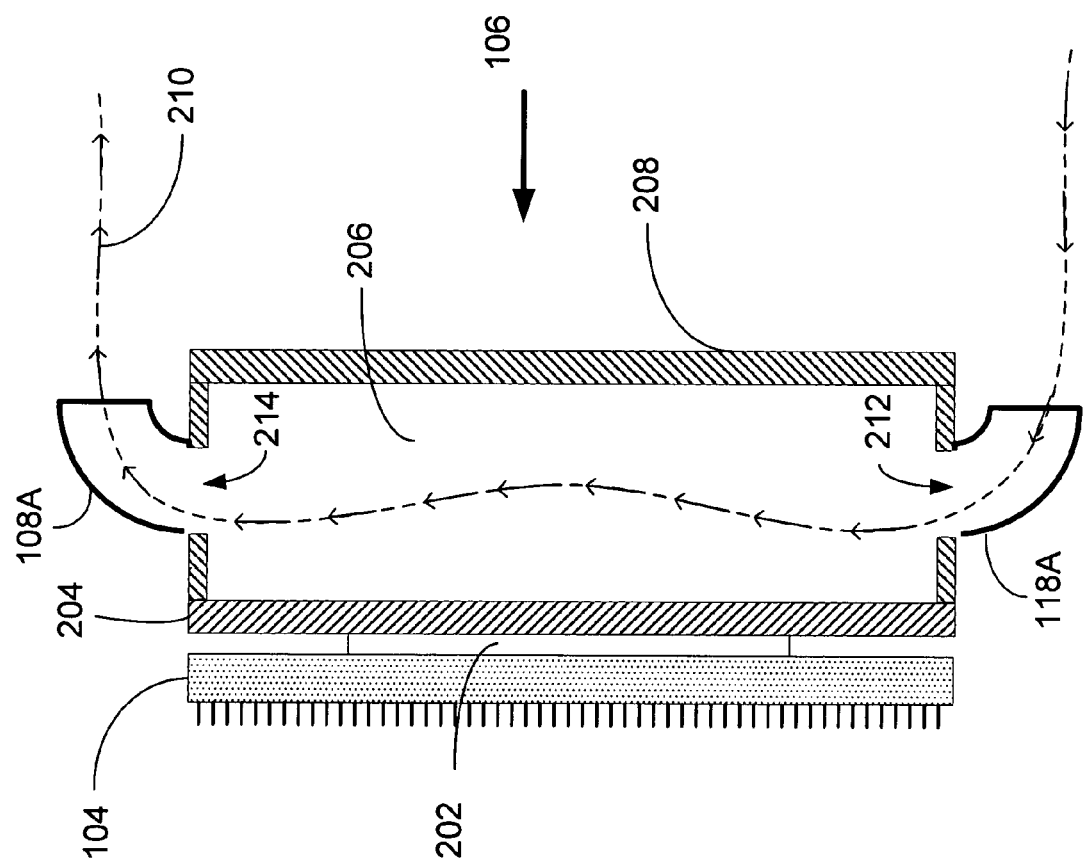
FIG. 2 displays a sectional view of a heat transfer unit implemented in accordance with the teachings of the present invention.

FIG. 2 displays a sectional view of a heat transfer unit 106 along section line 138 of FIG. 1. FIG. 2 displays a heat transfer unit, such as the heat transfer unit 106 of FIG. 1. A processor 104 is connected to the heat transfer unit 106. It should be appreciated that a variety of connection mechanisms may be used to connect the processor 104 to the heat transfer unit 106.

A housing 208 includes a cavity 206, which provides a conduit (i.e., liquid pathway) for liquid as shown by liquid flow path 210. A contact unit 204, such as a heat sink, interfaces with the processor 104. In one embodiment, the contact unit 204 engages the processor 104 through a contact mechanism 202, such as epoxy. In another embodiment, the contact medium 204 may be implemented with heat transfer pads, adhesives, thermal paste, etc. The housing 208 includes an inlet 212, which provides an input for liquid to enter cavity 206 and an outlet 214, which provides an opening for liquid to exit the cavity 206.

In one embodiment, cooled liquid is transported to the heat transfer unit 106 through output conduit 118A. At the inlet 212, cooled liquid enters the heat transfer unit 106. Heat is transported from processor 104 through contact unit 204 to the liquid housed in cavity 206. The cooled liquid, which enters the cavity 206, is heated. As the cooled liquid is heated, the cooled liquid is transformed into heated liquid.

Since heated liquid is lighter than the cooled liquid, the heated liquid rises in cavity 206. At the outlet 214, the lighter, heated liquid is positioned to exit the cavity 206. The lighter, heated liquid then exits the cavity 206 through the input conduit 108A. Consequently, after cooled liquid enters the cavity 206 at inlet 212 and is heated in the cavity 206, the heated liquid becomes lighter, rises, and exits the cavity at a point denoted by outlet 214. In one embodiment, the inlet 212, which receives the cooled liquid, is positioned below the outlet 214 where the heated liquid exits the cavity 206. In another embodiment, the inlet 212 and the outlet 214 may be repositioned in the housing 208 once the inlet 212 is positioned below the outlet 214.

Figure 3:
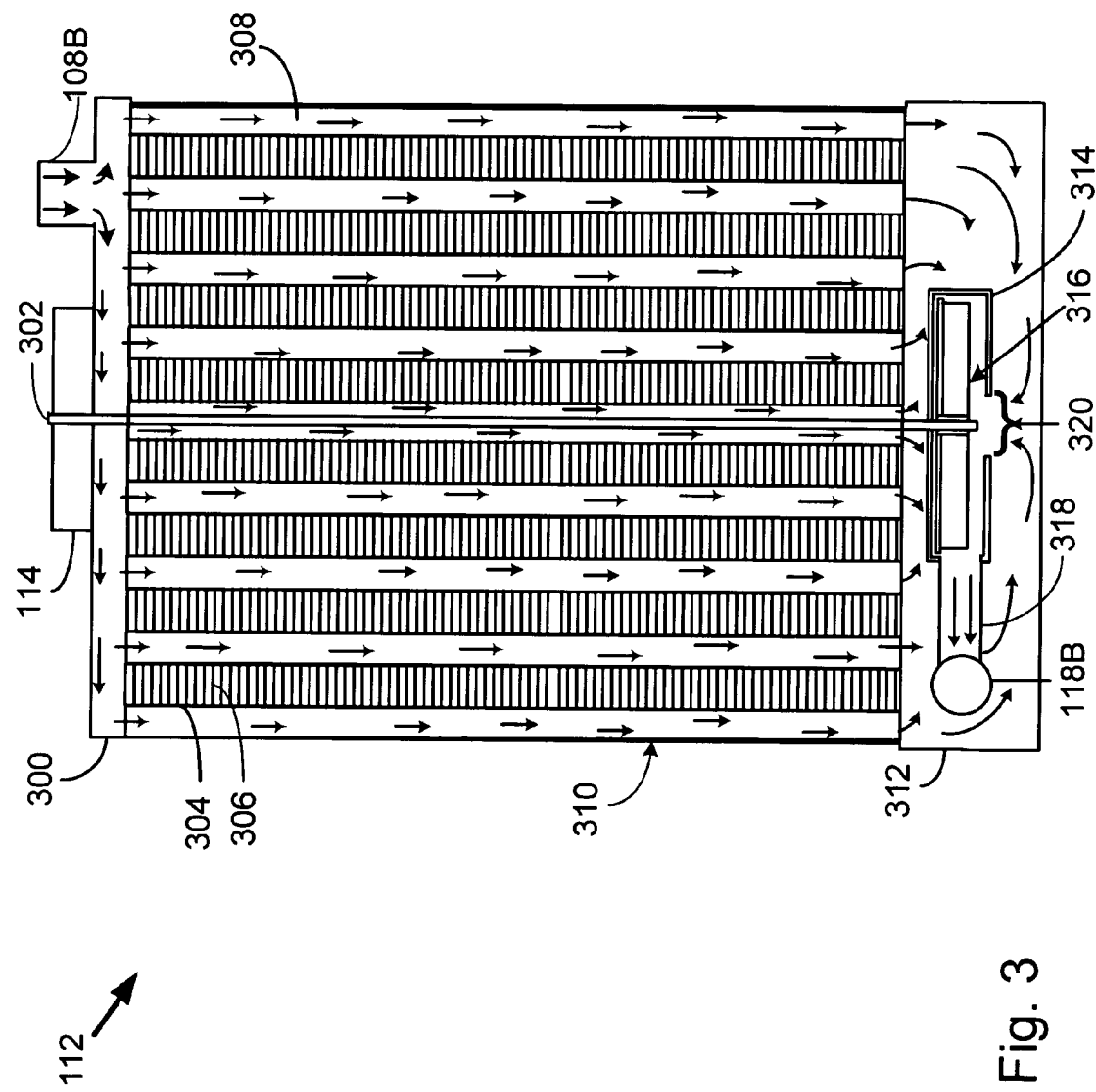
FIG. 3 displays a sectional view of a heat exchange unit implemented in accordance with the teachings of the present invention.

FIG. 3 displays a sectional view of a heat exchange unit implemented in accordance with the teachings of the present invention. FIG. 3 displays a sectional view of heat exchange unit 112 along section line 140 shown in FIG. 1. A cross section of the motor 114 is shown. The motor 114 is positioned above heat exchange unit 112; however, the motor 114 may be positioned on the sides or on the bottom of heat exchange unit 112. Further, heat exchange unit 112 may be deployed without the motor 114 and derive power from another location in the system.

Heat exchange unit 112 includes an input cavity 300, a heat dissipater 310, and an output cavity 312. In one embodiment, the motor 114 is connected through a shaft 302 to an impeller 316, disposed in an impeller case 314. In one embodiment, the input cavity 300 is connected to the input conduit 108B. In another embodiment, an impeller housing 314, an impeller casing input 320, and an impeller exhaust 318 are positioned within the output cavity 312. The impeller exhaust 318 is connected to the output conduit 118B. Further, in one embodiment, liquid tubes 308 run through the length of the heat dissipater 310 and transport liquid from the input cavity 300 to the output cavity 312. In yet another embodiment, heat exchange unit 112 may be fitted with a snap-in unit for easy connection to housing 100.

In one embodiment, the input cavity 300, the heat dissipater 310, and the output cavity 312 may be made from metal, metallic compounds, plastics, or any other materials that would optimize the system for a particular application. In one embodiment, the input cavity 300 and the output cavity 312 are connected to the heat dissipater 310 using solder, adhesives, or a mechanical attachment. In another embodiment, the heat dissipater 310 is made from copper. In yet another embodiment, the heat dissipater 310 could be made from aluminum or other suitable thermally conductive materials. For example, the fin units 304 may be made from copper, aluminum, or other suitable thermally conductive materials.

Although straight liquid tubes 308 are shown in FIG. 3, serpentine, bending, and flexible liquid tubes 308 are contemplated and within the scope of the present invention. In one embodiment, the liquid tubes 308 may be made from metal, metallic compounds, plastics, or any other materials that would optimize the system for a particular application. The liquid tubes 308 are opened on both sides to receive heated liquid from the input cavity 300 and to output cooled liquid to the output cavity 312. In one embodiment, the liquid tubes 308 are designed to encourage non-laminar flow of liquid in the tubes. As such more effectively cooling of the liquid is accomplished.

In one embodiment, a shaft 302 runs through the input cavity 300, through the heat dissipater 310 (i.e., through a liquid tube 308), to the output cavity 312. It should be appreciated that the shaft 302 may be made from a variety of materials, such as metal, metallic compounds, plastics, or any other materials that would optimize the system for a particular application.

The heat dissipater 310 includes a plurality of liquid tubes 308 and fin units 304 including fins 306. The liquid tubes 308, fin units 304, and fins 306 may each vary in number, size, and orientation. For example, the fins 306 maybe straight as displayed in FIG. 3, bent into an arch, etc. In addition, fins 306 may be implemented with a variety of angular bends, such as 45-degree angular bends. Further, the fins 306 are arranged to produce non-laminar flow of the air stream as the air denoted as 132 of FIG. 1 transition through the fins 306 to the air denoted by 134.

The motor 114 is positioned on one end of the shaft 302 and an impeller 316 is positioned on an oppositely disposed end of the shaft 302. In one embodiment, the motor 114 may be implemented with a brushless direct current motor; however, other types of motors, such as AC induction, AC, or DC servo-motors, may be used. Further, different types of motors that are capable of operating a pump are contemplated and are within the scope of the present invention.

In one embodiment, the pump is implemented with an impeller 316. However, it should be appreciated that other types of pumps may be deployed and are in the scope of the present invention for example, inline pumps, positive displacement pumps, caterpillar pumps and submerged pumps are contemplated and within the scope of the present invention. The impeller 316 is positioned within an impeller housing 314. In one embodiment, the impeller 316 and the impeller housing 314 are positioned in an output cavity 312. However, it should be appreciated that in an alternate embodiment, the impeller 316 and the impeller housing 314 may be positioned outside of the output cavity 312 at another point in the liquid cooling system. In a second embodiment, the pump is deployed at the bottom of the output cavity 312 and as such is self-priming.

During operation, heated liquid is received in the input cavity 300 from the input conduit 108B. The heated liquid is distributed across the liquid tubes 308 and flow through the liquid tubes 308. As the heated liquid flows through the liquid tubes 308, the heated liquid is cooled by the fin units 304 that transform the heated liquid into cooled liquid. The cooled liquid is then deposited in the output cavity 312 from the liquid tubes 308. As the shaft 302 rotates, the impeller 316 operates and draws the cooled liquid into the impeller housing 314. The cooled liquid is then transported out of the impeller housing 314 and into the output conduit 118B by the impeller 316.

It should be appreciated that in one embodiment of the present invention, the input conduit 108B is positioned above the heat dissipater 310 and above the output cavity 312. As such, as the heated liquid received in input cavity 300 flows through the heat dissipater 310, the heated liquid is transformed into cooled liquid, which is heavier than the heated liquid. The heavier, cooled liquid then falls to the bottom of the heat dissipater 310 and is deposited in the output cavity 312. The heavier, cooled liquid is output through the output conduit 118B using the impeller 316. In addition, in an alternate embodiment, when the impeller 316 is not operating, the movement of the heavier, cooled liquid generates momentum (i.e., convective liquid circulation) in the liquid cooling system of FIG. 1 as the cooled liquid moves from the input cavity 300, through the heat dissipater 310 to the output cavity 312.

In one embodiment, air flows over the fin units 304 and through the fins 306 to provide additional cooling of liquid flowing through the liquid tubes 308. For example, using FIG. 1 in combination with FIG. 3, air is generated by fan 116 and flows through the fin units 304 and fins 306 to provide additional cooling by cooling both the fin units 304 and the liquid flowing in the liquid tubes 308.

Figure 4:
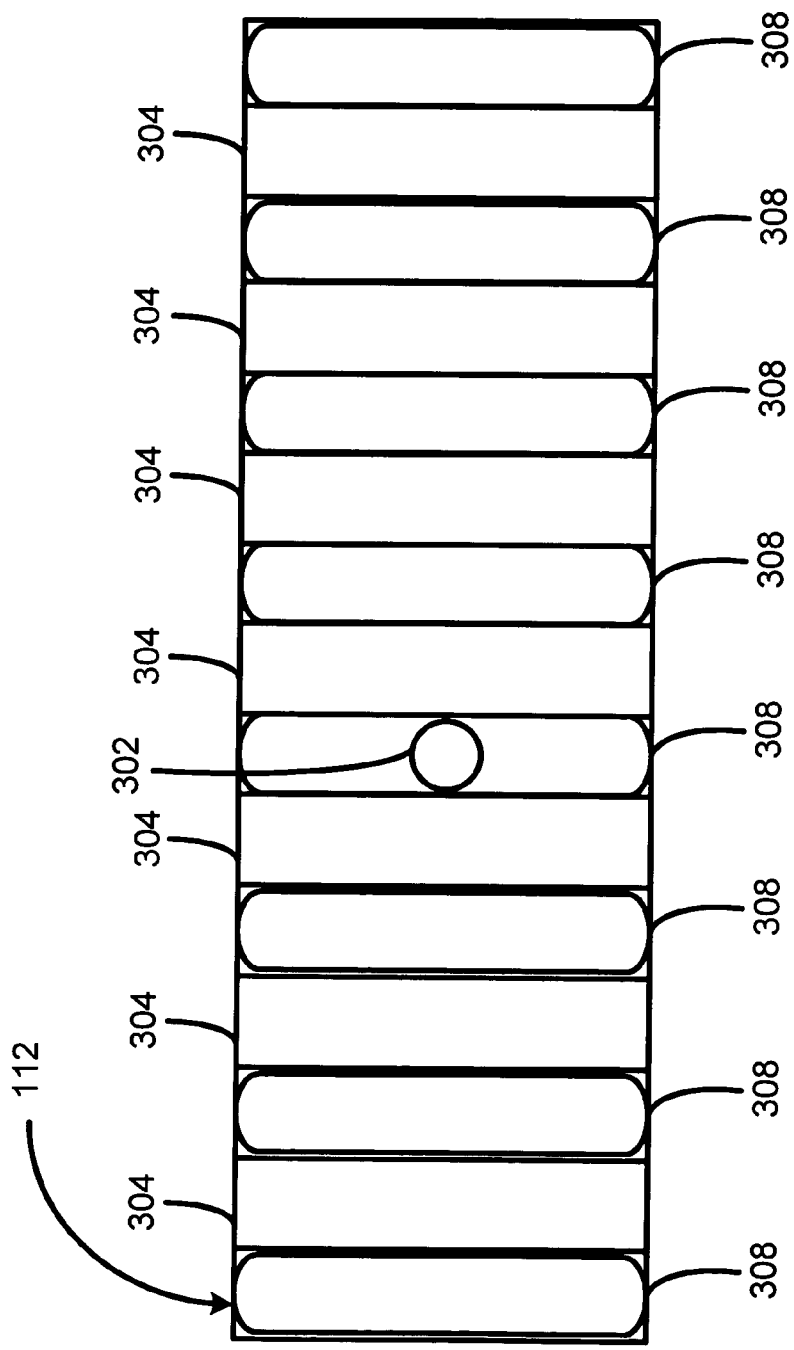
FIG. 4 displays a sectional view of a heat exchange unit implemented in accordance with the teachings of the present invention.

FIG. 4 displays a sectional view of a heat exchange unit 112 implemented in accordance with the teachings of the present invention. The numbering associated with FIG. 3 will be used to discuss the sectional view of heat exchange unit 112. The heat exchange unit 112 includes liquid tubes 308 through which liquid flows. The shaft 302 is disposed within a central liquid tube 308. In addition, fin units 304 are also shown.

Figure 5:
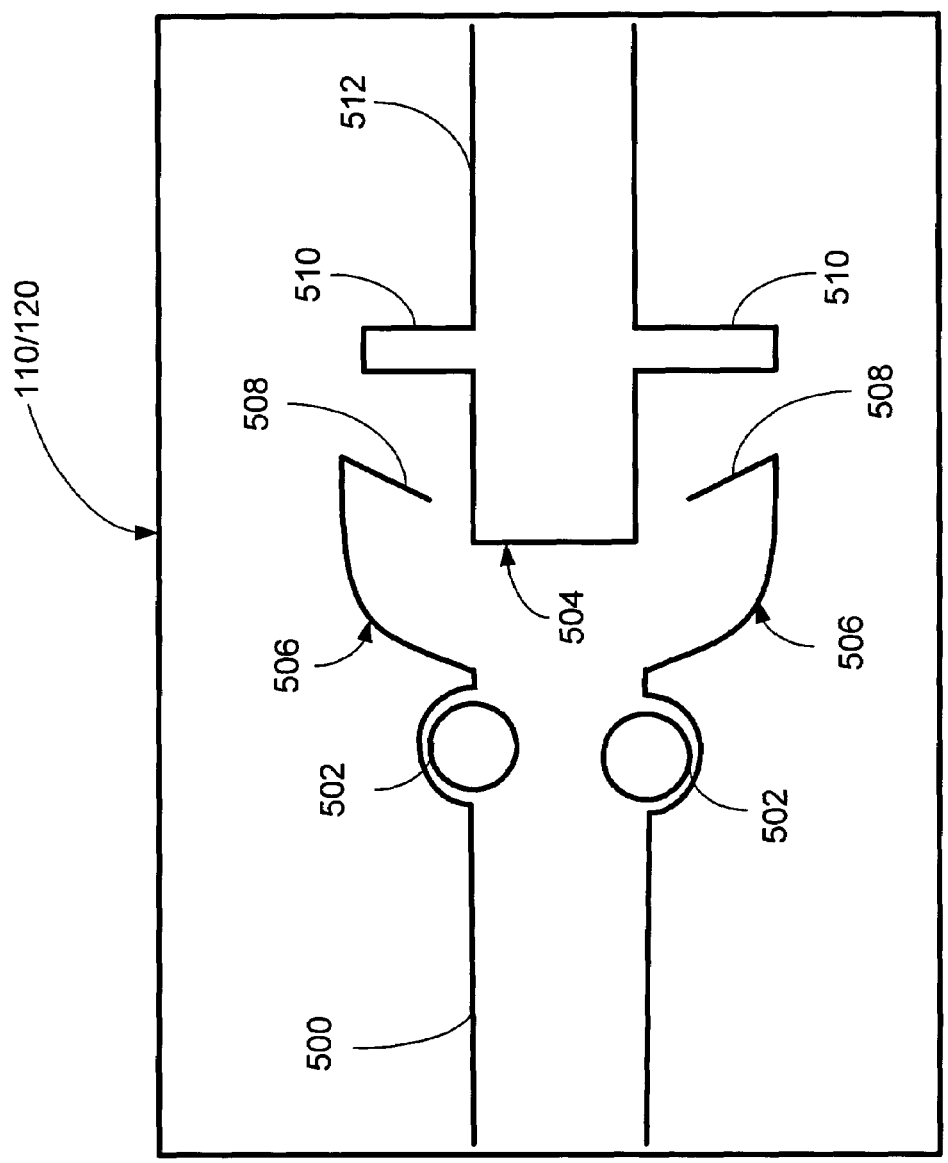
FIG. 5 displays a connection unit implemented in accordance with the teachings of the present invention.

FIG. 5 displays a connection unit 110/120, as shown in FIG. 1, implemented in accordance with the teachings of the present invention. In one embodiment, the connection unit 110/120 is designed to facilitate rapid installation of the liquid cooling system. A female conduit 500 and a male conduit 512 are shown. Sealing rings 502 are positioned within the female conduit 500. The female conduit 500 is terminated with a receptacle 506. The receptacle 506 includes springs 508 disposed therein.

The male conduit 512 includes a head 504 for insertion into the receptacle 506 of the female conduit 500. In addition, the male conduit 512 includes wings 510 extending from the body of the male conduit 512.

During operation, the male conduit 512 is inserted into the female conduit 500. Coupling is achieved by moving the female conduit 500 and male conduit 512 toward each other. As the female conduit 500 and the male conduit 512 are moved together, the end of male conduit 512, which is denoted by the head 504, enters the female conduit 500. During entry, the head 504 engages sealing rings 502 and causes the sealing rings 502 to form a seal to prevent any coolant leakage. Also, as the female conduit 500 and male conduit 512 are moved together, wings 510 push the springs 508 inward to the point where the wings 510 can pass the springs 508. After the wings 510 have cleared the springs 508, the springs 508 return to their original position illustrated in FIG. 5 (i.e., 508). The return of springs 508 captures the wings 510 and completes the union of the connection unit 110/120.

Figure 6:
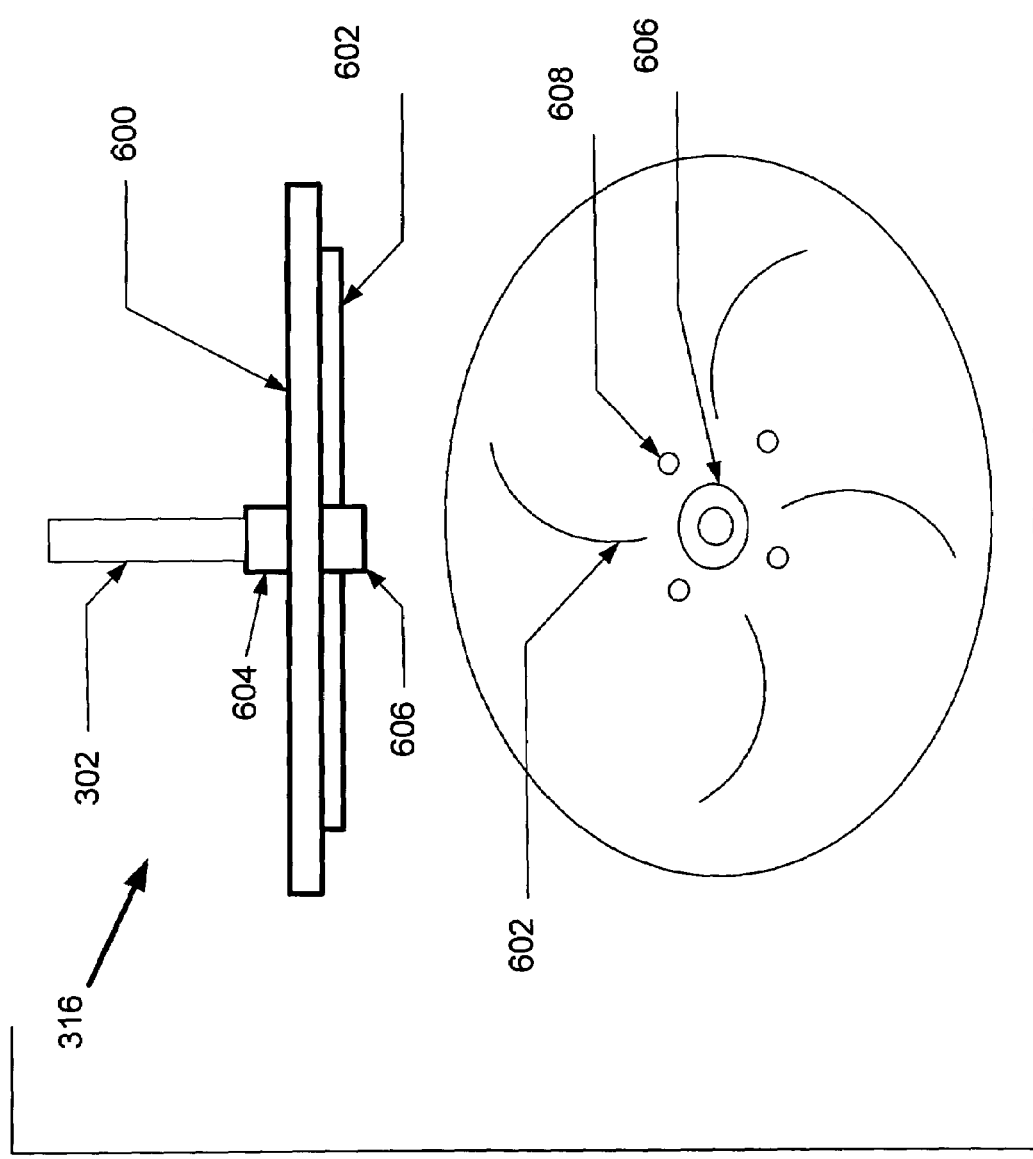
FIG. 6 displays an impeller implemented in accordance with the teachings of the present invention.

FIG. 6 displays an impeller implemented in accordance with the teachings of the present invention. FIG. 6 will be discussed in conjunction with FIG. 3. FIG. 6 provides both a bottom and side view of impeller 316. The impeller 316 includes a base plate 600 and blade members 602. The shaft 302 connects to the base plate 600 and the blade members 602. The base plate 600 and the blade members 602 may be connected to the shaft 302 with adhesives, by press fitting, machining, etc. In one embodiment, base plate 600 and blade member 602 are held in place by containment units 604 and 606. As a result, as the shaft 302 performs a circular revolution, both the base plate 600 and shaft 302 move through a circular revolution.

In one embodiment, a plurality of blade members 602 is implemented as shown in FIG. 6. Blade members 602 are radially curved from the shaft 302 outward through an arc. Impeller 316 may also include one or more apertures 608, formed through base plate 600 and through blade members 602. In one embodiment, apertures 608 may be slanted or oriented in a position relative to blade members 602 and base plate 600 to enhance liquid movement induced by impeller 316. It should also be appreciated that blade members 602 may be implemented with a variety of curved blades, straight blades, etc. In one embodiment of the present invention, a pump used to circulate liquid in the liquid cooling system is implemented with an impeller, such as impeller 316. However, it should be appreciated that alternative types of pumps may be used. In addition, in one embodiment (i.e., see FIG. 3), the pump is deployed in the output cavity 312; however, it should be appreciated that the pump may be deployed in another location.

Figure 7:
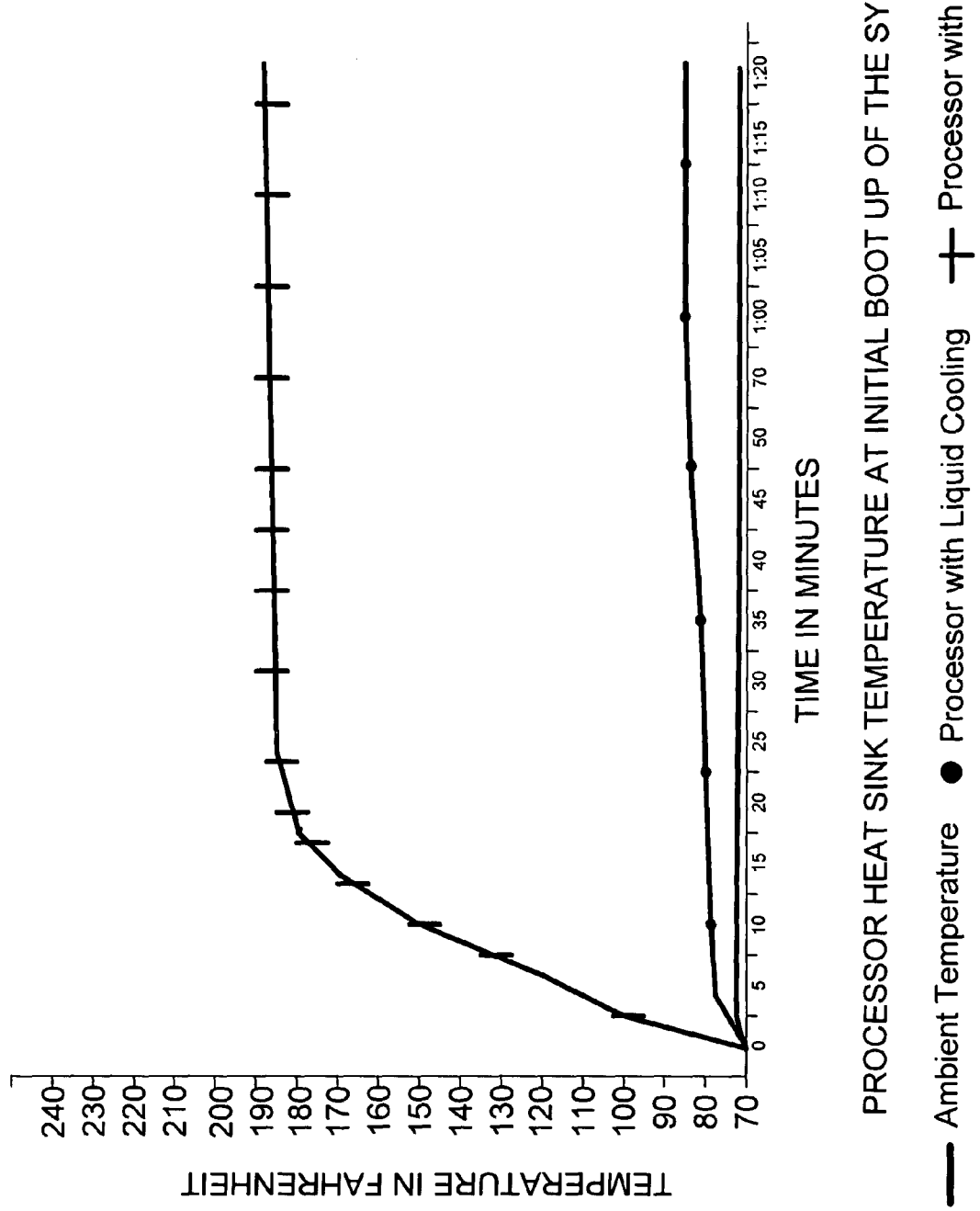
FIG. 7 displays a graph of a processor temperature at the initial boot up of a system.
Figure 8:
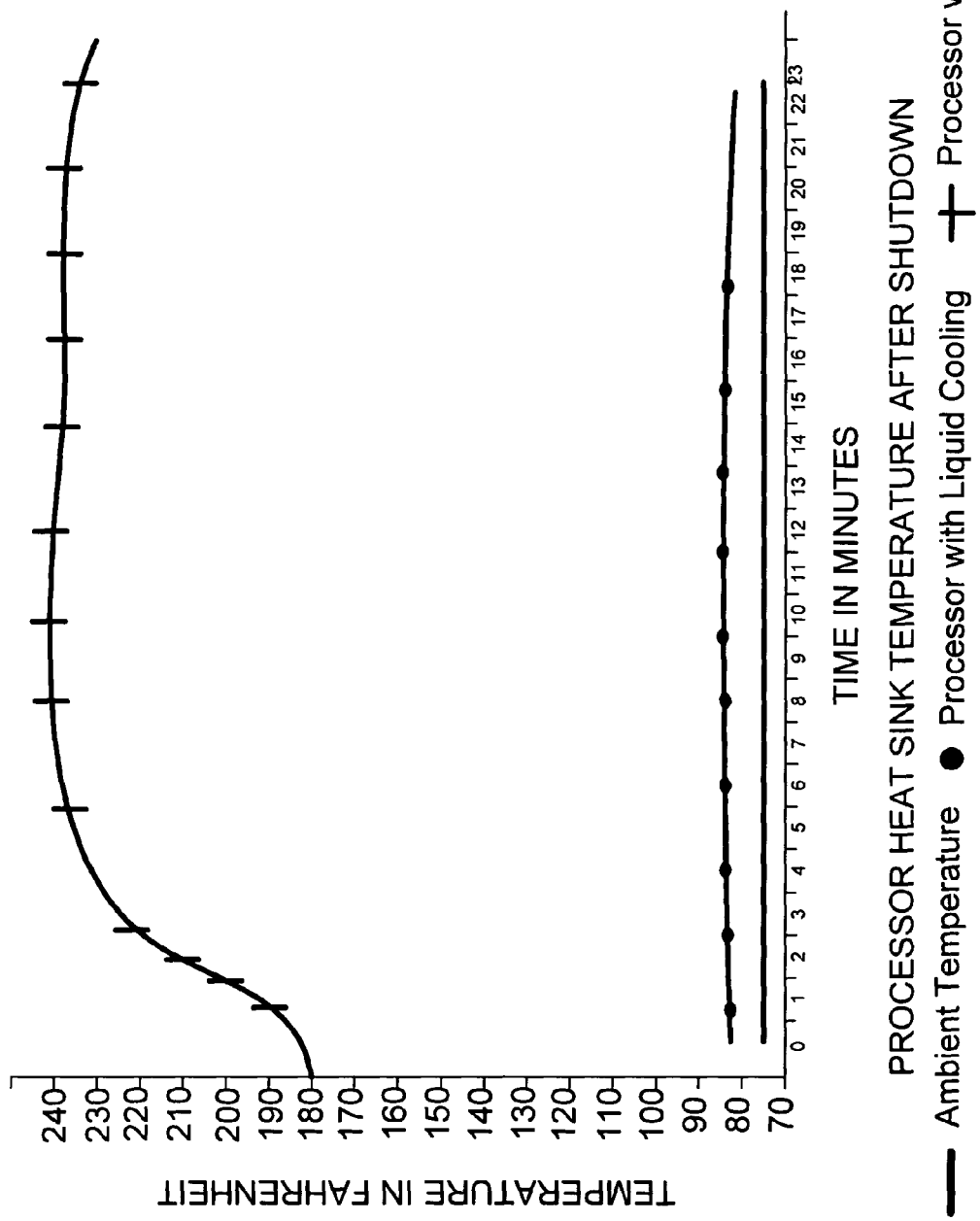
FIG. 8 displays a graph of a processor temperature after shutdown of a system.
Figure 9:
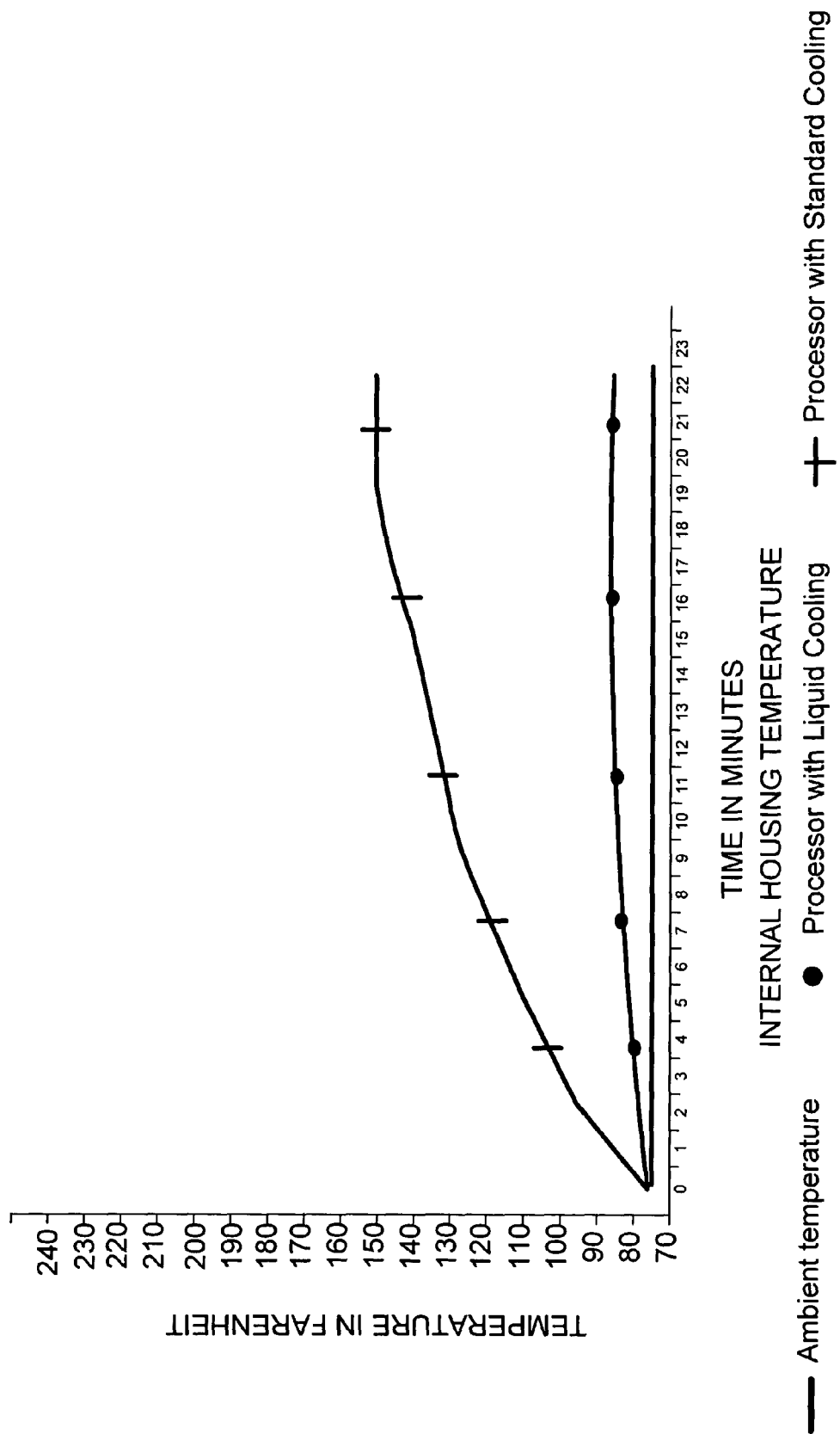
FIG. 9 displays a graph of the internal housing temperature of a computing system.

FIG. 7 displays a graph of a processor temperature at the initial boot up of a system. FIG. 8 displays a graph of a processor temperature after shutdown of a system. FIG. 9 displays a graph of the internal housing temperature of a computing system.

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A liquid cooling system for cooling heat-generating components in an electronic system having a self-contained heat exchange unit installable as a single unit within the electronic system and comprising:
   an input cavity for receiving heated liquid and distributing the heated liquid to a dissipater;
   a dissipater for receiving the heated liquid and cooling the liquid;
   an output cavity for receiving the cooled liquid from the dissipater and transporting the cooled liquid to the system;
   wherein the input cavity, the dissipater and the output cavity are disposed to form the self-contained heat exchange unit;
   one or more heat transfer units coupled to the heat generating components for receiving cooled liquid from the heat exchange unit and generating heated liquid for transportation to the heat exchange unit; and
   means for transporting cooled liquid from the heat exchange unit to the heat transfer units and for transporting heated liquid from the heat transfer units to the heat exchange unit.

2. A liquid cooling system as set forth in claim 1 wherein the heat transfer units and the heat exchange unit are deployed in a single unit installable as a single unit within the electronic system.

3. A liquid cooling system as set forth in claim 1 wherein the means for transporting includes a pump disposed in the heat exchange unit.

4. A liquid cooling system as set forth in claim 1 wherein the dissipater includes one or more liquid paths for transporting the liquid through the dissipater.

5. A liquid cooling system as set forth in claim 4 wherein said liquid paths include means for creating non-laminar flow of the liquid to enhance the transfer of heat from the liquid to the dissipater.

6. A liquid cooling system as set forth in claim 3 wherein the pump is disposed in the output cavity.

7. A liquid cooling system as set forth in claim 3, wherein the pump is a self-priming pump.

8. A liquid cooling system as set forth in claim 6 wherein the pump is disposed at the lowest possible point in the heat exchange unit.

9. A liquid cooling system as set forth in claim 3 wherein the pump includes an impeller, the heat exchange unit further comprising:
 a motor coupled to the heat exchange unit; and
 a shaft coupling the motor to the impeller means, the motor operating the impeller through the shaft.

10. A liquid cooling system as set forth in claim 9 wherein the motor is disposed on top of the heat exchange unit and away from possible contact with the liquid.

11. A liquid cooling system as set forth in claim 9 wherein the shaft is disposed through the liquid in the dissipater.

12. A liquid cooling system as set forth in claim 11 wherein no seal is necessary for the impeller.

13. A liquid cooling system as set forth in claim 1 wherein the heat exchange unit further comprises one or more fans disposed to direct air through the heat exchange unit and out of the electronic system housing.

14. The liquid cooling system as set forth in claim 13 wherein the dissipater includes fins for dissipating heat from the liquid and disposed so as to create a non-laminar flow of the air from the fans.

15. A liquid cooling system having a self-contained heat exchange unit installable as a single unit within a system with one or more heat-generating components and having one or more heat transfer units, the liquid cooling system comprising:
 an input cavity for receiving heated liquid and distributing the heated liquid to a dissipater;
 a dissipater for receiving the heated liquid and cooling the liquid;
 an output cavity for receiving the cooled liquid from the dissipater and transporting the cooled liquid to the system;
 wherein the input cavity, the dissipater and the output cavity are disposed to form the self-contained heat exchange unit;
 a heat transfer unit housing for coupling to heat-generating components;
 an inlet to the heat transfer unit housing;
 an outlet from the heat transfer unit housing positioned above the inlet;
 means for transporting liquid coupled to the inlet and the outlet; and
 wherein cooled liquid from the self-contained heat exchange unit enters the heat transfer unit housing at the inlet and heated liquid exits the heat transfer unit housing at the outlet.

16. The liquid cooling system in claim 15 for cooling heat generating components in an electronic system.

17. The liquid cooling system of claim 16 wherein the heat transfer units further comprise:
 a contact side coupled to the housing for forming a cavity for conveying liquid and thermally coupled to one or more heat-generating components, the contact side capable of transporting heat from the heat generating components to the liquid thereby producing heated liquid which rises in the cavity.

18. The liquid cooling system in claim 1 wherein the input cavity is positioned above the dissipater and the output cavity is positioned below the dissipater.

19. A liquid cooling system as set forth in claim 1 wherein the liquid coolant is a propylene glycol base.

20. A method of cooling heat generating components in an electronic system having a self-contained heat exchange unit installable as a single unit within the electronic system, the self-contained heat exchange unit including an input cavity for receiving heated liquid and distributing the heated liquid to a dissipater which cools the heated liquid and an output cavity for receiving the cooled liquid from the dissipater and transporting the cooled liquid to the electronic system, and wherein the input cavity, the dissipater and the output cavity are disposed to form the self-contained heat exchange unit, and further having one or more heat transfer units coupled to the heat generating components for receiving cooled liquid from the heat exchange unit and generating heated liquid for transportation to the heat exchange unit and means for transporting cooled liquid from the heat exchange unit to the heat transfer units and for transporting heated liquid from the heat transfer units to the heat exchange unit; the method comprising:
 a step for receiving heated liquid from the heat transfer units at the self-contained heat exchange unit;
 a step for cooling the liquid within the self-contained heat exchange unit for transportation to the heat transfer units;
 a step for transporting the cooled liquid to the heat transfer units by said means for transporting;
 a step for receiving cooled liquid from the self-contained heat exchange unit at the heat transfer units; and
 a step for heating the liquid within the heat transfer units by transferring heat from the heat-generating components to the liquid for transportation to the self-contained heat exchange unit.

21. A method of cooling as set forth in claim 20, the method further comprising the steps of:
 receiving heated liquid at an input cavity of the self-contained heat exchange unit and distributing the heated liquid to a dissipater in the self-contained heat exchange unit;
 cooling the liquid in the dissipater; and
 receiving the cooled liquid from the dissipater at an output cavity in the self-contained heat exchange unit for directing the cooled liquid to the system.

22. The method of claim 20 further comprising the step of directing air flow through the heat exchange unit and out of the electronic system to maintain cooler temperatures inside the electronic system housing.

23. A method of cooling as set forth in claim 20, comprising the steps of:
 performing convective circulation in one or more of the heat transfer units by positioning an outlet for heated liquid from the heat transfer units above an inlet of the heat transfer units which receives cooled liquid, the liquid rising in response to the transfer of heat from the heat generating components to the liquid in the heat transfer unit.

24. A method of cooling as set forth in claim 20 comprising the additional steps of performing convective circulation by:
 positioning the input cavity above the dissipater; and
 positioning the output cavity below the dissipater.

25. A method of cooling as set forth in claim 20, the method further comprising the steps of:
 performing forced circulation of the liquid in the liquid cooling system by a pump; and
 performing convective circulation of the liquid in the liquid cooling system by disposing inlets and outlets for cooler liquid below inlets and outlets for heated liquid.

26. The method in claim 25 further including the step of dissipating heat generated by the heat generating components in response to the forced circulation and convective circulation.

27. The method in claim 25 wherein the heat generating components are cooled after power is shut down in the system.

28. The method in claim 25 for saving power consumed in the system.

29. A method of cooling as set forth in claim 20 further comprising the step of using propylene glycol as the base for the liquid coolant.

30. A motherboard further comprising the liquid cooling system of any one of those in claims 1, 3 or 15.

31. A computer further comprising the liquid cooling system of any one of those in claims 1, 3 or 15.

32. A telecommunications system further comprising the liquid cooling system of any one of those in claims 1, 3 or 15.

33. A cellular telephone further comprising the liquid cooling system of any one of those in claims 1, 3 or 15.

34. A device including a processor further comprising the liquid cooling system of any one of those in claims 1, 3 or 15.

35. An optical device further comprising the liquid cooling system of any one of those in claims 1, 3 or 15.

* * * * *